(12) United States Patent
Rasmussen et al.

(10) Patent No.: US 11,214,483 B2
(45) Date of Patent: Jan. 4, 2022

(54) MEMS MICROPHONE AND METHOD OF MANUFACTURE

(71) Applicant: TDK Corporation, Tokyo (JP)

(72) Inventors: Kurt Rasmussen, Herlev (DK); Jan Tue Ravnkilde, Hedehusene (DK)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/079,276

(22) Filed: Oct. 23, 2020

(65) Prior Publication Data

US 2021/0122626 A1 Apr. 29, 2021

(30) Foreign Application Priority Data

Oct. 24, 2019 (DE) .......................... 102019128767.7

(51) Int. Cl.
*H04R 19/00* (2006.01)
*B81B 7/00* (2006.01)
*H04R 19/04* (2006.01)
*B81C 1/00* (2006.01)

(52) U.S. Cl.
CPC .......... *B81B 7/0061* (2013.01); *B81B 7/0048* (2013.01); *B81C 1/00158* (2013.01); *B81C 1/00531* (2013.01); *H04R 19/005* (2013.01); *H04R 19/04* (2013.01); *B81B 2201/0257* (2013.01); *H04R 2201/003* (2013.01)

(58) Field of Classification Search
CPC ................. H04R 19/04; H04R 19/005; H04R 2201/003; H04R 2499/11; B81B 7/0061; B81B 7/0048; B81B 2201/0257; B81B 2203/0307; B81B 2203/0127; B81C 1/00158; B81C 1/00531; B81C 1/00182; B81C 2201/0132; B81C 1/00571
See application file for complete search history.

(56) References Cited

U.S. PATENT DOCUMENTS

| | | | |
|---|---|---|---|
| 9,458,009 B2 | 10/2016 | Dehe et al. | |
| 10,462,579 B2 | 10/2019 | Barzen | |
| 2004/0140732 A1 | 7/2004 | Truninger et al. | |
| 2010/0044808 A1 | 2/2010 | Dekker et al. | |
| 2010/0327702 A1 | 12/2010 | Martin et al. | |
| 2018/0376270 A1* | 12/2018 | Wang | H04R 31/00 |
| 2019/0092624 A1* | 3/2019 | Walther | B81C 1/00166 |

FOREIGN PATENT DOCUMENTS

| | | |
|---|---|---|
| DE | 102014103341 A1 | 9/2014 |
| DE | 102016114451 A1 | 2/2017 |

* cited by examiner

*Primary Examiner* — Matthew A Eason
(74) *Attorney, Agent, or Firm* — Slater Matsil, LLP

(57) ABSTRACT

In an embodiment a MEMS microphone includes a substrate, a shield layer, a central insulation layer and a membrane, wherein the substrate has an upper surface with a first opening therein, wherein the shield layer is arranged between the upper surface of the substrate and the membrane, the shield layer having a second opening, wherein the central insulation layer is arranged between the shield layer and the membrane, the shield layer comprising a dielectric bulk material having a third opening and an etch stopper forming an edge of the central insulation layer towards the third opening such that the dielectric bulk material of the central insulation layer is completely enclosed between the shield layer, the etch stopper and the membrane, and wherein all openings are arranged one above another to form a common sound channel to the membrane.

17 Claims, 3 Drawing Sheets

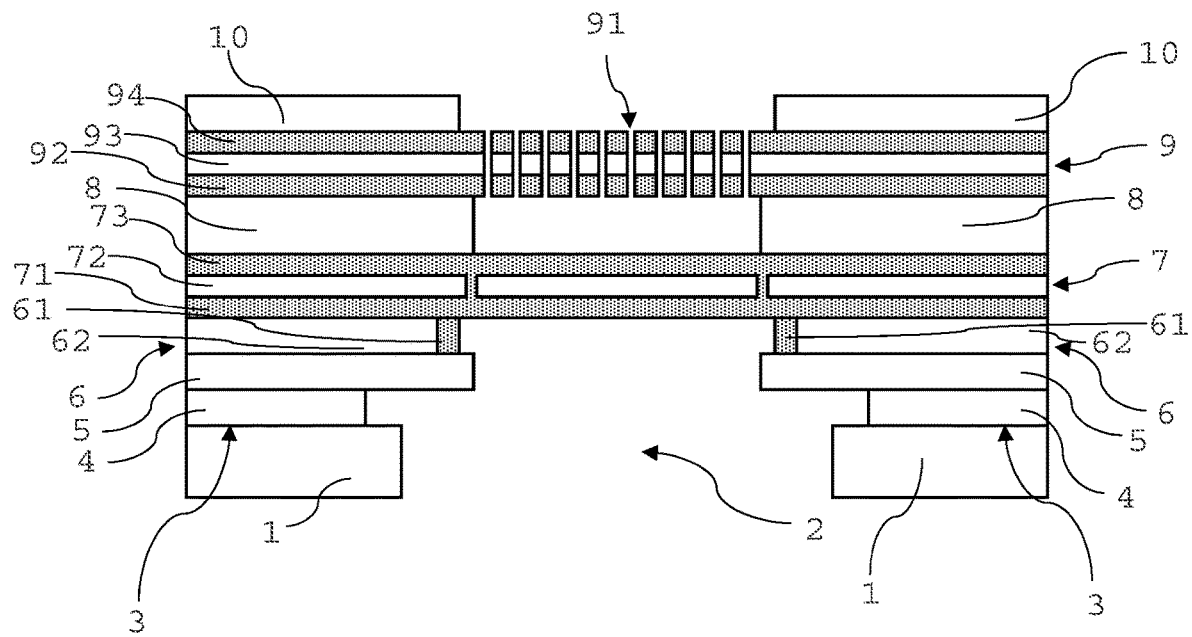
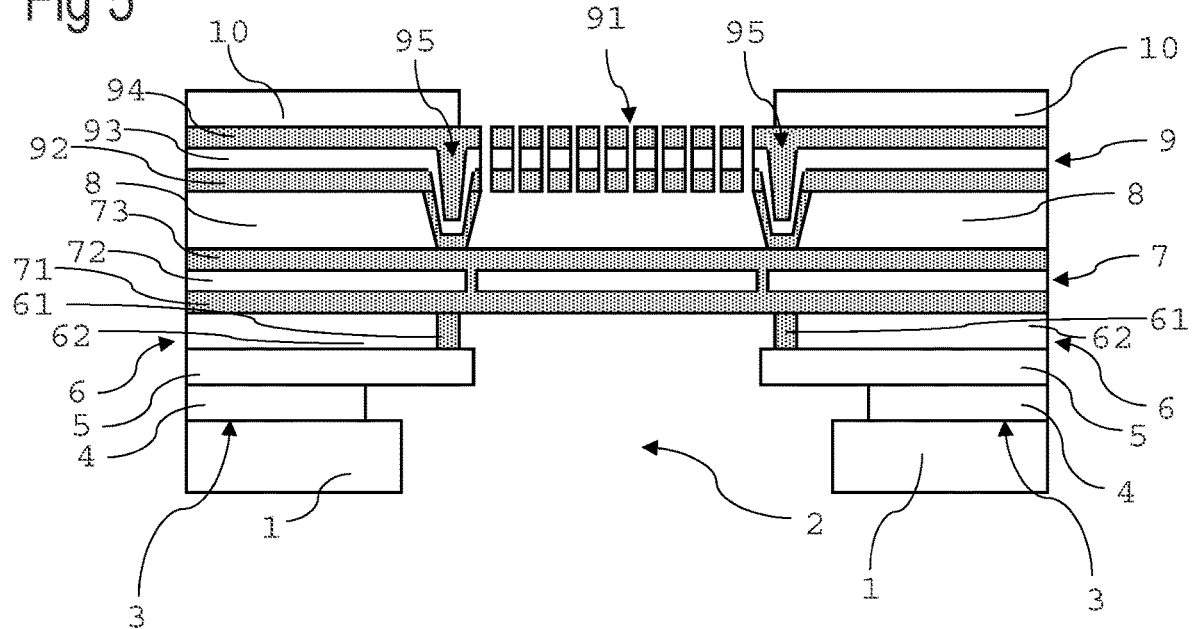

MEMS MICROPHONE AND METHOD OF MANUFACTURE

CROSS-REFERENCE TO RELATED APPLICATIONS

This application claims priority to German Application No. 102019128767.7 filed on Oct. 24, 2019, which application is hereby incorporated herein by reference.

BACKGROUND

MEMS microphones in which MEMS (Micro Electro Mechanical System) technology is utilized are incorporated into several modern applications, such as smart phones, head phones, digital cameras, or others. For applications with moderate demands concerning the acoustic characteristics easy to fabricate and simply constructed single back plate MEMS microphones can be applied. It is crucial to maintain a simple and cost efficient fabrication process while achieving sufficient reliability and long lifetime of the device.

Previously this reliability demand could not be met satisfactorily or only on the cost of a demanding or time consuming fabrication process for single back plate MEMS microphones.

In single back plate MEMS microphones previous to this disclosure, typically, the membranes were suspended in silicon oxide layers one below the membrane and one above it.

In addition, the fabrication of MEMS microphones can involve several etching steps to produce a sound channel and to expose the free standing membrane area. Especially, when using fast and cost efficient deep reactive-ion etching (DRIE) processes, the sound channel is subject to etching method depended diameter variations. Thus the lower membrane suspension position may be ill defined and large deviations in the free standing membrane diameter in the order of tens of microns can occur. In consequence, also the difference in the positions of lateral suspensions that is between the positions of lower and upper membrane suspension can become ill defined.

Under large sound pressure these shortcomings can lead to contact of the membrane with the sound channel edge in the substrate, creating artifacts and causing punctual mechanical stress on the membrane, potentially leading to membrane breakage.

Moreover, silicon oxide as a membrane suspension material has a comparatively low tensile strength, in particular when notch or protrusion artifacts are present from etching. Especially, if the lateral suspension difference between lower and upper membrane suspension is large, fractures may occur under high pressure onto the membrane.

So far slow DRIE etching processes partly including costly equipment or biasing of masks during the etching were applied, to minimize the uncertainty in the lower membrane suspension position and to minimize the position difference between lower and upper membrane suspension. These typically slow processes can increase the process costs.

In another previous approach the lateral positions of the upper and lower suspension were switched, which, however, adds deleterious parasitic capacitances into the MEMS microphone.

SUMMARY

Embodiments provide a MEMS microphone with long term reliability and increased resistivity to membrane or membrane suspension breakage.

Further embodiments provide reliable membrane suspensions.

A MEMS microphone is specified, which comprises a substrate, a shield layer, a central insulation layer, and a membrane. The substrate has an upper surface with a first opening therein. The shield layer is arranged between the upper surface of the substrate and the membrane, and it has a second opening.

The central insulation layer is arranged between the shield layer and the membrane. It comprises: a dielectric bulk material having a third opening, and an etch stopper forming the edge of the central insulation layer towards the third opening such that the dielectric bulk material of the central insulation layer is completely enclosed between shield layer, etch stopper and membrane.

All openings are arranged one above another to form a common sound channel to the membrane.

With this arrangement of the shield layer it is possible to precisely define and set the lateral position of the etch stopper on the shield layer with a potential accuracy of 1 µm or below, for example by an inexpensive front side lithography method. Thus, also the opening below the membrane, which is the opening in the central insulation layer can be defined with the same precision, as the etch stopper frames this opening. The etch stopper avoids etching of the central insulation layer beyond the lateral position of the etch stopper and thus the third opening can be defined with high accuracy.

In one embodiment, the MEMS microphone may contain a lower insulation layer that is arranged between the upper surface of the substrate and the shield layer. The material of the lower insulation layer can be silicon oxide.

Such a lower insulation layer can electrically decouple the shield layer from the Si substrate, which allows the application of different potentials to shield layer and substrate.

Furthermore, in one embodiment the etch stopper of the MEMS microphone forms the lower membrane suspension.

By this, the position of the lower membrane suspension can be defined by the etch stopper, which can be positioned precisely with a potential accuracy of 1 µm or below.

Also, the etch stopper of the MEMS microphone consists of a material with lower etching rate than the dielectric bulk material of the central insulation layer between the shield layer and the membrane.

Thus the etch stopper can protect the dielectric bulk material of the central insulation layer during etching processes applied during the formation of the sound channel. In view of the embodiment in which the etch stopper may serve as lower membrane suspension, this has the advantage, that the lower suspension position can stay mainly unaffected by etching processes. This is in contrast to cases, where the lower membrane suspension is formed by the dielectric bulk material itself, which is typically subject to etching method depended position variations.

In addition, the etch stopper of the MEMS microphone may consist of a material with higher tensile strength than the dielectric bulk material of the central insulation layer.

In view of the embodiment in which the etch stopper serves as lower membrane suspension it is advantageous that mechanical stress mainly occurs in the etch stopper having a higher tensile strength instead of in the dielectric bulk material with lower tensile strength when pressure impacts on the membrane.

The etch stopper may consist of low stress silicon nitride and the dielectric bulk material of the central insulation layer may be silicon oxide.

Low stress silicon nitride can be a silicon nitride based material with comparatively low tensile stress in the order of 250 MPa or below. In this embodiment it has the preferable property that low stress silicon nitride has both lower etching rate and nevertheless a higher tensile strength than silicon oxide. Therefore, it can protect the silicon oxide during etching procedures and act as robust lower membrane suspension.

The shield layer of the MEMS microphone may consist of a material with lower etching rate than the substrate material in deep reactive-ion etching processes.

In particular the shield layer of the MEMS microphone may consist of a material with lower etching rate in a deep reactive-ion etching processes than the substrate material and than silicon oxide.

In this embodiment, the dimensions of the shield layer may not be subject to etching method dependent deviations. Thus also, the shield layer together with the etch stopper can protect the dielectric bulk material of the central insulation layer during etching. Therefore, over etching of the lower membrane suspension and an ill-defined lower membrane suspension position can be avoided, even if fast etching methods are used. A fast etching process is preferred as this saves cost-producing processing time.

The material the shield layer consists of or may be chosen from the following list including highly doped poly-Si, undoped poly-Si, porous silicon, and low stress silicon nitride. The substrate material can be Si.

In particular in the embodiment where highly doped poly-Si is chosen as a shield layer material, the shield layer is electrically conductive. With this property, the shield layer can be utilized as bootstrapping electrode, which can reduce parasitic capacitances during readout of the membrane node.

In one embodiment the membrane may comprise a layered structure. The layered structure of the membrane may comprise an electrically conducting membrane core layer, and two outer layers below and above the membrane core layer sandwiching it. The outer layers may consist of a dielectric material with higher tensile strength than the core layer.

In particular, the electrically conducting membrane core layer can consist of highly doped poly-Si, and the outer layers of the membrane can consist of low stress silicon nitride.

In such an embodiment the highly doped poly-Si core layer can provide the conductivity necessary for a MEMS membrane, and the silicon nitride outer layers can increase the robustness of the membrane due to their comparatively higher tensile strength. Furthermore, in such an embodiment, the low stress silicon nitride of the lower membrane layer may serve as upper protection layer of the dielectric bulk material of the central insulation layer during etching processes. In addition, in an embodiment in which also the etch stopper material is silicon nitride, the lower outer layer of the membrane and the etch stopper can be fabricated in one process step. Thereby, the additional process efforts and resulting costs for producing the etch stopper can be minimized.

In one embodiment the MEMS microphone may comprise a back plate arranged above the membrane, and an upper insulation layer that may be arranged between membrane and back plate. The upper insulation layer may comprise a fourth opening flushing with the sound channel below the membrane. The upper insulation layer may consist of silicon oxide.

In particular the back plate may comprise a depression in form of a trench, wherein a bottom of the trench can be the lowest-lying part of the back plate. At the trench bottom, the back plate may be in direct contact with the membrane. Furthermore, the trench can surround and thus horizontally frame the opening of the upper insulation layer such that the upper insulation layer can be completely enclosed by membrane, back plate and trench.

In such an embodiment, the back plate including the trench can act as upper suspension for the membrane and as etch protection for the upper insulation layer. Typically, the back plate can comprise materials with higher tensile strength and lower etching rate than silicon oxide, which can be used in the upper insulation layer. Thus the upper membrane suspension defined by the back plate depression can have a higher durability compared to the case where the upper membrane suspension is formed only by the silicon oxide of the upper insulation layer. Furthermore, the trench and with it the upper membrane suspension can be produced and positioned by a lithographic process. Thus the upper membrane suspension position can be defined more accurately as by etching of silicon oxide without any etch protection.

In particular in view of the embodiment, where the etch stopper forms the lower membrane suspension, the suspension position difference, which is the lateral distance between lower and upper membrane suspension can be defined with an accuracy of 1 µm or below. According to a further embodiment a method for manufacturing a MEMS microphone is provided comprising the following steps:

a) on an upper surface of a substrate the following are formed one upon another: a continuous lower insulation layer, a shield layer comprising a circular opening, and a central insulation layer, comprising a ring-shaped trench that exposes the shield layer at the bottom of the trench, b) on top of the central insulation layer comprising the ring-shaped trench a lower dielectric outer layer of a membrane is deposited, which thereby also forms the etch stopper in the trench of the central insulation layer, and further a lithographically patterned electrically conducting membrane core layer, and an upper dielectric outer layer of the membrane are formed upon the former, c) an upper patterned insulation layer is formed on top of the membrane, d) on top of the upper patterned insulation layer a back plate is formed from a single layer or from a plurality of partial layers, and e) a sound channel is etched in two subsequent steps: First the substrate is etched by deep reactive-ion etching, and subsequently the insulation layers are etched by isotropic wet etching, whereby the extent of the etching in the central insulation layer is defined by the shield layer and the etch stopper.

In one embodiment, method step a) comprises planarizing the surface of the non-continuous central insulation layer by chemical-mechanical polishing previous to method step b).

Without a polishing step, the height difference between the circular opening in the shield layer and shield layer would be transferred to the as deposited central insulation layer. By the chemical-mechanical polishing step the resulting depression in the central insulation layer can be planarized. Thereby it can be avoided, that the depression is also transferred to the layers, which are fabricated above.

In one embodiment the membrane is patterned in method step b) to comprise venting holes previous to method step c).

The method can also comprise in method step c) that the upper patterned insulation layer comprises a circular trench, which partly exposes the upper dielectric outer layer of the membrane. In addition, in method step d), the following layers of the back plate can be formed one upon another on the upper patterned insulation layer having the circular trench: a lower dielectric outer layer of the back plate, a lithographically patterned electrically conducting back plate core layer, and an upper dielectric outer layer of the back plate. These as assembled layers of the back plate can be patterned previous to method step e).

BRIEF DESCRIPTION OF THE DRAWINGS

In the following the invention is explained in greater detail on the basis of exemplary embodiments and the associated figures.

The figures serve solely for elucidating the invention and are therefore illustrated only schematically and not in a manner true to scale. Individual parts may be illustrated in an enlarged manner or in a distorted manner in terms of the dimensions. Therefore, neither absolute nor relative dimensional specifications can be inferred from the figures. Identical or identically acting parts are provided with identical reference signs.

FIG. 4 shows in a schematic cross section the upper section of an exemplary embodiment of a MEMS microphone, wherein the membrane is layered and structured, and the back plate is layered; and FIG. 5 shows in a schematic cross section the upper section of an exemplary embodiment of a MEMS microphone, wherein the membrane is layered and structured, and the back plate is layered, and comprises a trench.

DETAILED DESCRIPTION OF ILLUSTRATIVE EMBODIMENTS

Figure 1:
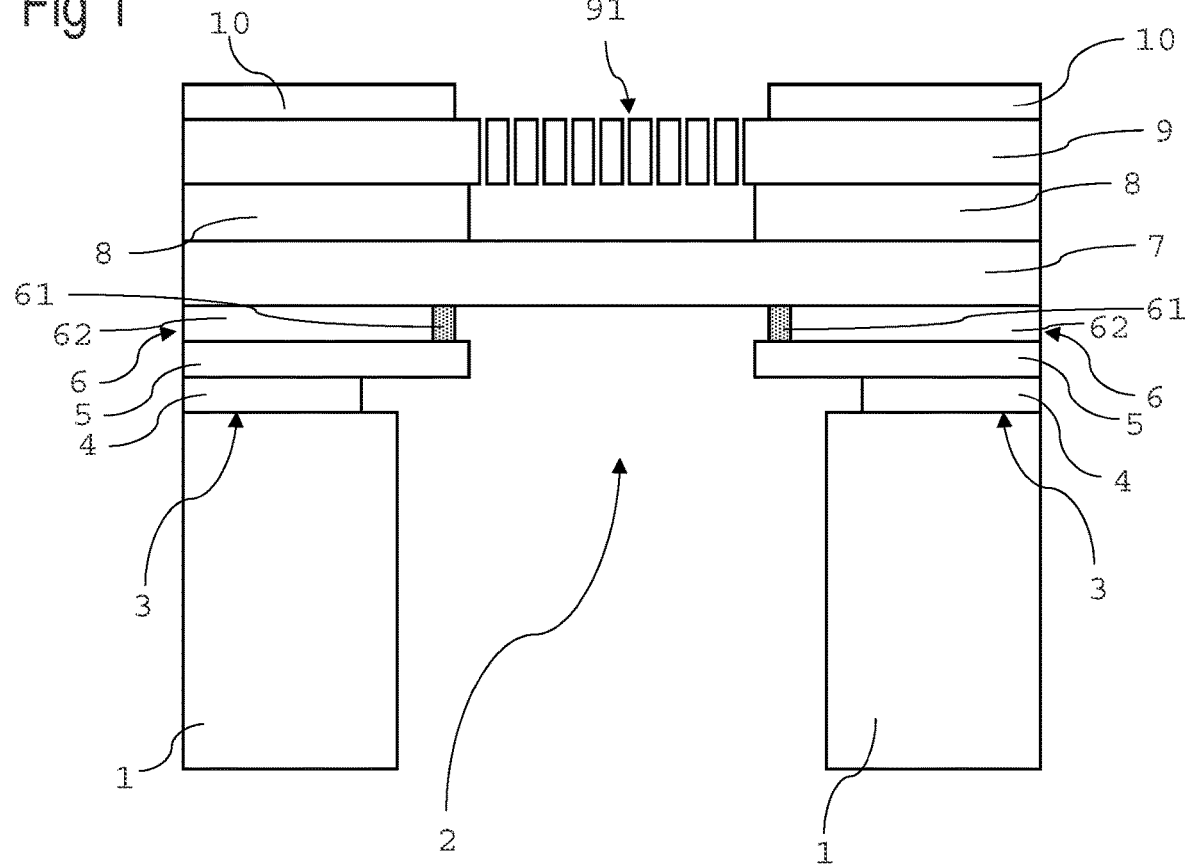
FIG. 1 shows in a schematic cross section an exemplary embodiment of a MEMS microphone.

FIG. 1 shows in a schematic cross section an exemplary embodiment of a MEMS microphone. It comprises a substrate 1 having an upper surface 3 and a sound channel 2, a lower insulation layer 4, a shield layer 5, a central insulation layer 6, an etch stopper 61, a dielectric bulk material partial layer 62, a membrane 7, an upper insulation layer 8, a back plate 9, a structured back plate inner area 91, and an electrical contact layer 10.

The substrate 1 in the present exemplary embodiment can be a silicon substrate, which may be doped. The upper substrate surface 3 is the upper terminating surface of the substrate.

The lower insulation layer 4 is assembled on top of the upper substrate surface 3. In the present exemplary embodiment the lower insulation layer 4 can be comprised of silicon oxide. The preferred thickness of the lower insulation layer 4 in the present exemplary embodiment can be 0.5 µm.

The shield layer 5 is arranged on top of the lower insulation layer 4. The shield layer 5 can consist of a material chosen from the following list including highly doped poly-Si, undoped poly-Si, porous silicon, and low stress silicon nitride. In the present exemplary embodiment highly doped poly-Si is the preferred material for the shield layer 5. An exemplary thickness of the shield layer 5 in the present exemplary embodiment can be 0.5 µm.

The central insulation layer 6 is arranged on top of the shield layer 5. It comprises the etch stopper 61, the dielectric bulk material partial layer 62. An exemplary thickness of the second insulation layer 6 in the present exemplary embodiment can be 0.5 µm. The preferred material of the etch stopper 61 in the present exemplary embodiment is low stress silicon nitride and the dielectric bulk material of the dielectric bulk material partial layer 62 is silicon oxide.

The membrane 7 is arranged on top of the central insulation layer 6, and the etch stopper 61 serves as lower membrane suspension. The membrane 7 comprises a suitable electrically conducting material, such as for example highly doped poly-Si. Furthermore, the membrane 7 may be structured, to comprise venting holes. An exemplary thickness of the membrane 7 in the present exemplary embodiment can be 0.52 µm.

The sound channel 2 is formed below the membrane 7 by openings in the upper surface of the substrate 3, the lower insulation layer 4, the shield layer 5, and the central insulation layer 6. The membrane 7 is free standing over the sound channel.

The sound channel 2 in the present exemplary embodiment is formed by etching methods. Thereby, the sound channel openings in the upper substrate surface 3 and the lower insulation layer 4 can be subject to method induced horizontal and vertical diameter deviations.

The shield layer 5, the etch stopper 61, and the membrane 7 can have a low or vanishing etching rate in the etching processes applied to form the sound channel 2. Thereby, the dielectric bulk material of partial layer 62 of the central insulation layer 6 is protected during etching of the sound channel 2 by the shield layer 5, the etch stopper 61, and the membrane 7. Therefore, the sound channel openings in the shield layer 5 and the central insulation layer 6 are not subject to etching method depended deviations in diameter. Instead, the sound channel opening (third opening) directly below the membrane, which is the sound channel opening in the central insulation layer 6, is defined by the position of the etch stopper 61.

In this exemplary embodiment, the position of the etch stopper 61 can be positioned with an accuracy of 1 µm or below. Thus, the opening in the central insulation layer 6 framed by the etch stopper 61 and forming the lower membrane suspension can define the lower free standing diameter of the membrane with an accuracy of 1 µm or below.

The upper insulation layer 8 is arranged on top of the membrane 7. It comprises an opening as an extension of the sound channel. The material of the upper insulation layer 8 can be silicon oxide in the present exemplary embodiment. An exemplary thickness of the third insulation layer 8 in the present exemplary embodiment can be 1 µm.

The back plate 9 is arranged on top of the upper insulation layer 8. It comprises a suitable electrically conducting material, such as for example highly doped poly-Si. The back plate 9 is free standing above the opening in the upper insulation layer 8. The back plate 9 comprises the structured back plate inner area 91 in the region of the back plate 9, which is freestanding above the opening in the upper insulation layer 8. In the structured back plate inner area 91 the back plate can be perforated to allow for fast pressure relaxation between both sides of the back plate.

The electrical contact layer 10 is arranged on top of the back plate but isolated against the back plate. From the electrical contact layer 10 electrical contacts for example for the back plate, the membrane, the poly shield or other potential components may be formed. The electrical contact layer comprises suitable metals or alloys of metals from the list containing Ti, W, Cr, Ni, or Au.

Figure 2:
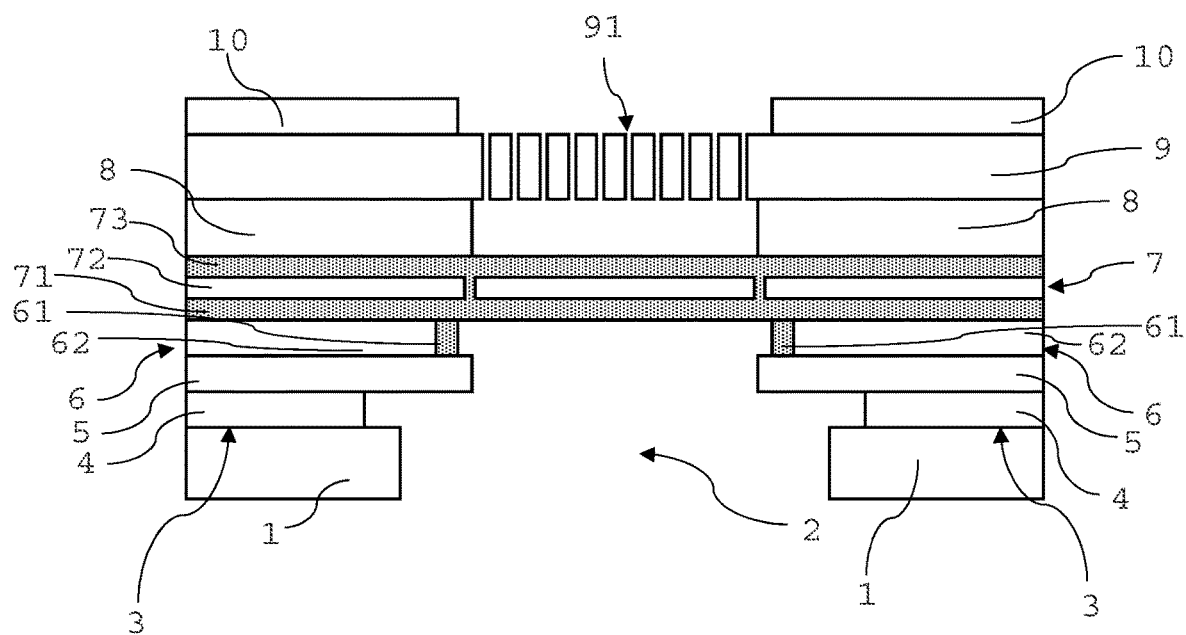
FIG. 2 shows in a schematic cross section the upper section of an exemplary embodiment of a MEMS microphone, wherein the membrane is layered and structured.

FIG. 2 shows in a schematic cross section the upper section of an exemplary embodiment of a MEMS microphone, wherein the membrane is layered and structured. It comprises a substrate 1, a sound channel 2, an upper surface of the substrate 3, a lower insulation layer 4, a shield layer 5, a central insulation layer 6, an etch stopper 61, a dielectric bulk material partial layer 62, a membrane 7, a lower outer membrane layer 71, an electrically conducting membrane core layer 72, an upper outer membrane layer 73, an upper insulation layer 8, a back plate 9, a structured back plate inner area 91, and an electrical contact layer 10.

The exemplary embodiment of a MEMS microphone shown in FIG. 2 can be a modified embodiment of the exemplary embodiment shown in FIG. 1 and described above. Except for the membrane 7, the arrangement of the other parts may comply with the arrangement shown in FIG. 1 described above.

The membrane 7, in the exemplary embodiment shown in FIG. 2 is a layered membrane, comprising the lower outer membrane layer 71, the electrically conducting membrane core layer 72, and the upper outer membrane layer 73.

The electrically conducting membrane core layer 72 is the layer forming the membrane core. It comprises an electrically conductive material, preferably highly doped poly-Si.

The lower and upper outer membrane layers 71 and 73 sandwich the electrically conducting membrane core layer 72 from below and above, respectively. Thereby, the lower outer membrane layer 71, is arranged directly on the central insulation layer 6 and the upper outer membrane layer 73 is arranged directly below the upper insulation layer 8.

Both outer membrane layers 71 and 73 can consist of a dielectric material. Preferentially, the dielectric material of the outer membrane layers 71 and 73 can be low stress silicon nitride, which has a higher tensile strength than the membrane core layer and has a lower etching rate then silicon oxide.

The thickness of each outer membrane layer 71 and 73 can be 0.11 (mi. The thickness of the electrically conducting membrane core layer 72 may be 0.3 µm.

In this exemplary embodiment, the lower outer membrane layer 71, together with the etch stopper 61, and the shield layer 5 can serve as etch protection for the dielectric bulk material partial layer 62. In addition the potential material identity of the lower outer membrane layer 71 and the etch stopper 61, allows fabrication of both in a single common fabrication step.

FIGS. 3a to 3e show different stages of an exemplary manufacturing process for a MEMS microphone in a schematic cross-sectional view.

The manufacturing process addressed in FIGS. 3a to 3e can be an exemplary manufacturing process for the exemplary embodiment of a MEMS microphone as shown in FIG. 2.

Figure 3A:
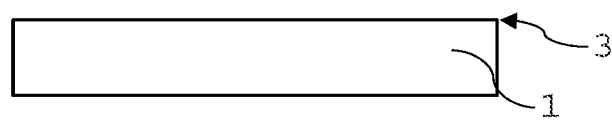
FIGS. 3a to 3e show several steps of an exemplary manufacturing process for a MEMS microphone with schematic cross-sectional views of the MEMS fabrication intermediates.

In a first step shown in FIG. 3a a silicon substrate 1 is provided, comprising an upper surface of the substrate 3.

Figure 3B:
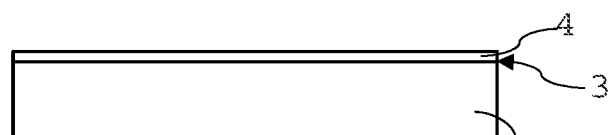

In a second step shown in FIG. 3b, a continuous lower insulation layer 4 is applied on the substrate. The material of the continuous lower insulation layer 4 can be silicon oxide, which, for example, can be a thermal oxide of the silicon substrate 1, or originate from a plasma enhanced chemical vapor deposition (PECVD) method using tetraethyl orthosilicate (TEOS). The thickness of the continuous lower insulation layer 4 can be 0.5 µm.

Figure 3C:

In a third step shown in FIG. 3c a shield layer 5 comprising a circular opening 51 is formed on the continuous lower insulation layer 4. In the circular opening 51, the lower insulation layer 4 is exposed. The shield layer 5 can consist of a material chosen from the following list including highly doped poly-Si, undoped poly-Si, porous silicon, and low stress silicon nitride. In the present exemplary embodiment highly doped poly-Si is the preferred material for the shield layer 5. It can be fabricated by any suitable method, such as for example low pressure chemical vapor deposition (LPCVD). The thickness of the shield layer 5 can be 0.5 µm.

Figure 3D:
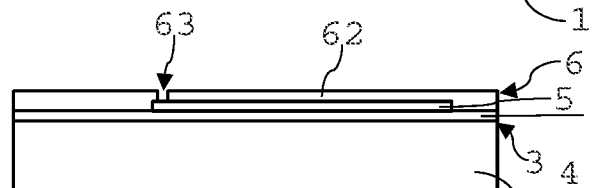

In a fourth step shown in FIG. 3d, a dielectric material layer, which is comprised in the central insulation layer 6, is applied on top of the shield layer 5 and the bare lying area of the lower insulation layer 4 below the circular opening 51. Layer 6 comprises a dielectric bulk material partial layer 62 and a trench 63 that exposes a fraction of the shield layer 5 at the bottom of the trench 63. The material of the dielectric bulk material partial layer 62 may be silicon oxide, which can be deposited by any suitable method, such as for example a PECVD method using TEOS.

As an accordingly fabricated dielectric bulk material partial layer 62 comprises a depression due to the height difference between shield layer 5 and circular opening 51, optionally an additional process step may be included. Thereby, first the depression in the dielectric bulk material partial layer 62 is planarized by chemical-mechanical polishing, and subsequently additional silicon oxide may be deposited, to provide continuity in the dielectric bulk material partial layer 62. The additional silicon oxide deposition step, may be performed by any suitable method such as a PECVD method using TEOS.

Independent of such an optional process step, the preferred thickness of the dielectric bulk material partial layer 62 may be 0.5 µm.

Figure 3E:
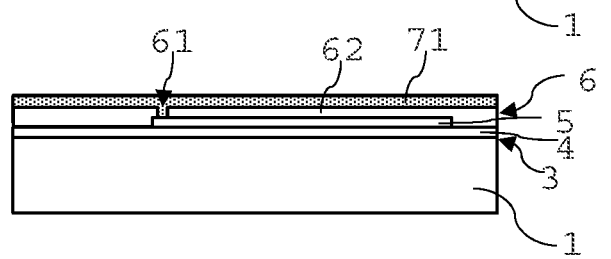

In a fifth step shown in FIG. 3e, a lower dielectric outer layer 71 of the membrane 7 is applied. In the deposition process the trench 63 is filled with the deposited material to simultaneously form the etch stopper 61 in the trench of the dielectric bulk material partial layer 62. The material of the etch stopper 61 and a lower dielectric outer layer 71 may be low stress silicon nitride, which can be deposited by any suitable method, as for example LPCVD. The thickness of the lower dielectric outer layer 71 can be 0.11 µm.

Further layers of the MEMS microphone can be fabricated by any suitable procedure including any suitable materials but are not shown in FIG. 3.

For example, as shown in FIG. 2, an electrically conducting membrane core layer 72 can be arranged on top of the lower dielectric outer layer 71 of the membrane 7. The material of the electrically conducting membrane core layer 72 can be highly doped poly-Si, which may be deposited by LPCVD. The thickness of the electrically conducting membrane core layer 72 may be 0.3 µm.

Optionally an annealing step may be applied to the electrically conducting membrane core layer 72 and the lower dielectric outer layer 71, to adjust for stress.

The electrically conducting membrane core layer 72 may subsequently be patterned and structured, for example to include venting holes.

An upper dielectric outer layer 73 can be formed upon the electrically conducting membrane core layer 72. The material upper dielectric outer layer 73 may be low stress silicon nitride, which can be deposited by any suitable method, as for example LPCVD. The thickness of the upper dielectric outer layer 71 can be 0.11 µm.

Subsequently the as assembled membrane 7 may be further patterned and structured, for example to include venting holes.

On the membrane 7 an upper insulation layer 8 can be applied. The material of the upper insulation layer 8 may be silicon oxide, which may be deposited by any suitable method, such as for example a PECVD method using TEOS. The upper insulation layer 8 can be patterned. The thickness of the upper insulation layer 8 can be 1 µm.

On the upper insulation layer 8 a back plate 9 is fabricated. Possible optional embodiments for the back plate 9 and its manufacture is addressed below in the discussion of FIGS. 4 and 5.

On the back plate, an electrical contact layer 10 is fabricated. The electrical contact layer 10 may comprise electrical contacts for example for the back plate, the membrane, the poly shield or other potential components. The electrical contact layer may comprise one or more suitable metals or alloys of metals from the list containing Ti, W, Cr, Ni and Au.

After the above described fabrication of the layers a sound channel 2 can be formed by appropriate etching methods. First a back side DRIE process can be applied to etch the substrate 1 from the bottom that is from a side of the substrate opposite to upper substrate surface 3. The complete sound channel together with the opening in the upper insulation layer 8 is formed by subsequently etching through the further layers below the membrane thereby using another suitable etch process e.g. wet etching. In each layer openings are formed having a respective diameter dependent on the etching rate of the respective layer material. The openings are etched into the silicon oxide of the insulation layers 4 and 8 and of the dielectric bulk material partial layer 62. For this, further suitable methods, as for example hydrogen fluoride vapor methods can be applied.

The etching degree, the diameters of the sound channel openings and the variation in the diameters of the sound channel openings in the substrate 1, the lower insulation layer 4, and in the upper insulation layer 8 depend on the etching conditions.

The diameter of the sound channel opening etched in the central insulation layer 6 is independent of the etching conditions. Instead, it is defined by the position of the etch stopper, which prevents over etching of the central insulation layer 6 by protecting the dielectric bulk material partial layer 62 outside the sound channel.

FIG. 4 shows in a schematic cross section the upper section of an exemplary embodiment of a MEMS microphone, wherein the membrane is layered and structured, and the back plate is layered. It comprises a substrate 1, a sound channel 2, an upper surface of the substrate 3, a lower insulation layer 4, a shield layer 5, a central insulation layer 6, an etch stopper 61, a dielectric bulk material partial layer 62, a membrane 7, a lower outer membrane layer 71, an electrically conducting membrane core layer 72, an upper outer membrane layer 73, an upper insulation layer 8, a back plate 9, a structured back plate inner area 91, a lower outer back plate layer 92, an electrically conducting back plate core layer 93, an upper outer back plate layer 94 and an electrical contact layer 10.

The exemplary embodiment of a MEMS microphone shown in FIG. 4 is a modified embodiment of the exemplary embodiment shown in FIG. 2 described above. Except for the back plate 9, the arrangement of the other parts can comply with the arrangement shown in FIG. 2.

The back plate 9, in the exemplary embodiment of FIG. 4 is a layered back plate, comprising the lower outer back plate layer 92, the electrically conducting back plate core layer 93, and the upper outer back plate layer 94.

The electrically conducting back plate core layer 93 comprises an electrically conductive material, preferably highly doped poly-Si.

The lower and upper outer back plate layer 92 and 94 sandwich the electrically conducting back plate core layer 93 from below and above, respectively. Thereby, the lower outer back plate layer 93, is arranged directly on the upper insulation layer 8.

Both outer back plate layers 92 and 94 can consist of a dielectric material. Preferentially, the dielectric material of the outer back plate layers 92 and 94 is low stress silicon nitride.

The fabrication of the layered back plate can be performed by any suitable method, such as LPCVD methods. In addition patterning of individual back plate layers 92, 93, and 94, or of the assembled back plate 9 can be performed, for example, by lithographic methods.

The thickness of the lower outer back plate layer 92 can be 0.13 µm. The thickness of the electrically conducting back plate core layer 93 may be 0.33 µm. The thickness of the upper outer back plate layer 92 can be 0.5 µm.

FIG. 5 shows in a schematic cross section the upper section of an exemplary embodiment of a MEMS microphone, wherein the membrane is layered and structured, and the back plate is layered, and comprises a depression. It comprises a substrate 1, a sound channel 2, an upper surface of the substrate 3, a lower insulation layer 4, a shield layer 5, a central insulation layer 6, an etch stopper 61, a dielectric bulk material partial layer 62, a membrane 7, a lower outer membrane layer 71, an electrically conducting membrane core layer 72, an upper outer membrane layer 73, an upper insulation layer 8, a back plate 9, a structured back plate inner area 91, a lower outer back plate layer 92, an electrically conducting back plate core layer 93, an upper outer back plate layer 94, a back plate trench 95, and an electrical contact layer 10.

The exemplary embodiment of a MEMS microphone shown in FIG. 5 is a modified embodiment of the exemplary embodiment shown in FIG. 4 which is described above. Except for the back plate 9 and the upper isolation layer 8, the arrangement of the other parts may comply with the arrangement shown in FIG. 4 which is described above.

The back plate 9, in the exemplary embodiment shown in FIG. 5 comprises a trench 95 formed like a depression. The trench 95 has a trench bottom, which is the lowest lying part of the back plate 9. At the trench bottom, the back plate 9 is in direct contact with membrane 7. As both the membrane 7 and the back plate 9 can comprise a layered structure including dielectric outer layers 71, 73, 92, and 94, the electrically conducting core layers of the membrane and back plate 72 and 93 can remain electrically insulated against each other. The trench 95 frames the sound channel opening in the upper insulation layer 8 above the membrane.

The fabrication method of the trenched back plate 9 can comply with the method described above for the layered back plate 9. However, the trench 95 is pre-formed by forming a respective pattern/trench into the upper insulation layer 8 previous to the assembly of the back plate on the upper insulation layer 8. For the formation of the trench preform in the upper insulation layer 8 any suitable method can be applied, such as lithography based techniques. At the bottom of the trench preform the surface of the membrane 6 is exposed, previous to the assembly of the back plate 9.

With this trenched back plate design, the trenched back plate 9 together with the membrane 7 can serve as etch protection for the upper insulation layer 8 during etching of the sound channel opening into the upper insulation layer 8.

Thereby, the diameter of the sound channel opening in the upper insulation layer 8 is defined by the trench 95, which may be positioned with the accuracy of lithographic methods. Therefore, it is not subject to etching dependent variations in diameter.

Furthermore, the trench 95 can serve as upper membrane suspension. With both an accurately positioned etch stopper as lower membrane suspension and an accurately positioned back plate trench 95 as upper membrane suspension the suspension difference and the diameter of the free standing membrane area within the sound channel can be defined within an accuracy of 1 μm or below.

What is claimed is:

1. A MEMS microphone comprising:
a substrate;
a shield layer;
a central insulation layer; and
a membrane,
wherein the substrate has an upper surface with a first opening therein,
wherein the shield layer is arranged between the upper surface of the substrate and the membrane, the shield layer having a second opening,
wherein the central insulation layer is arranged between the shield layer and the membrane, the shield layer comprising:
a dielectric bulk material having a third opening, and
an etch stopper forming an edge of the central insulation layer towards the third opening such that the dielectric bulk material of the central insulation layer is completely enclosed between the shield layer, the etch stopper and the membrane, and
wherein all openings are arranged one above another to form a common sound channel to the membrane.

2. The MEMS microphone according to claim 1,
wherein a lower insulation layer is arranged between the upper surface of the substrate and the shield layer, and
wherein a material of the lower insulation layer is silicon oxide.

3. The MEMS microphone according to claim 1, wherein the etch stopper forms a lower membrane suspension.

4. The MEMS microphone according to claim 1, wherein the etch stopper consists essentially of a material with a lower etching rate than the dielectric bulk material of the central insulation layer between the shield layer and the membrane.

5. The MEMS microphone according to claim 1, wherein the etch stopper consists essentially of a material with a higher tensile strength than the dielectric bulk material of the central insulation layer.

6. The MEMS microphone according to claim 1, wherein the etch stopper consist essentially of a low stress silicon nitride and the dielectric bulk material of the central insulation layer is silicon oxide.

7. The MEMS microphone according to claim 1, wherein the shield layer consists essentially of a material with lower etching rate than a substrate material.

8. The MEMS microphone according to claim 2, wherein the shield layer consist essentially of a material with lower etching rate than a substrate material and the silicon oxide.

9. The MEMS microphone according to claim 1,
wherein the shield layer consist essentially of a material chosen from highly doped poly-Si, undoped poly-Si, porous silicon, or low stress silicon nitride, and
wherein a substrate material is Si.

10. The MEMS microphone according to claim 1,
wherein the membrane comprises a horizontally layered structure,
wherein the horizontally layered structure comprises an electrically conducting membrane core layer,
wherein two outer layers below and above the membrane core layer sandwich the membrane core layer, and
wherein the outer layers consists essentially of a dielectric material with a higher tensile strength than the membrane core layer.

11. The MEMS microphone according to claim 10,
wherein the electrically conducting membrane core layer consists essentially of highly doped poly-Si, and
wherein the outer layers of the membrane consist essentially of a low stress silicon nitride.

12. The MEMS microphone according to claim 1, further comprising:
a back plate arranged above the membrane; and
an upper insulation layer arranged between the membrane and the back plate,
wherein the upper insulation layer comprises a fourth opening that continues the sound channel above the membrane, and
wherein the upper insulation layer consists essentially of silicon oxide.

13. The MEMS microphone according to claim 12,
wherein the back plate comprises a trench,
wherein a trench bottom is a lowest-lying part of the trench,
wherein the back plate is in direct contact with the membrane at the trench bottom, and
wherein the trench horizontally frames the fourth opening of the upper insulation layer such that the upper insulation layer is completely enclosed by the membrane, the back plate and the trench in the back plate.

14. A method for manufacturing a MEMS microphone, the method comprising:
forming on an upper surface of a substrate the following layers one upon another: a continuous lower insulation layer, a shield layer comprising a circular opening, and a central insulation layer comprising a ring-shaped trench that exposes the shield layer at a bottom of the trench;
depositing on top of the central insulation layer comprising the ring-shaped trench a lower dielectric outer layer of a membrane thereby also forming an etch stopper in the trench of the central insulation layer;
forming a lithographically patterned electrically conducting membrane core layer, and an upper dielectric outer layer of the membrane;
forming an upper patterned insulation layer on top of the membrane;
forming on top of upper patterned insulation layer a back plate from a single layer or from a plurality of partial layers; and
etching a sound channel comprising first etching the substrate by deep reactive-ion etching, and subsequently etching the insulation layers by isotropic wet etching, wherein an extent of the etching in the central insulation layer is defined by the shield layer and the etch stopper.

15. The method according to claim 14, wherein a surface of the non-continuous central insulation layer is planarized by chemical-mechanical polishing before depositing the lower dielectric outer layer of the membrane.

16. The method according to claim 14, wherein the membrane is patterned to comprise venting holes before forming the upper patterned insulation layer on top of the membrane.

17. The method according to claim 14,
wherein the upper patterned insulation layer comprises a circular trench, which partly exposes the upper dielectric outer layer of the membrane,
wherein, on the upper patterned insulation layer comprising the circular trench the following layers of the back plate are formed one upon another, a lower dielectric outer layer of the back plate, a lithographically patterned electrically conducting back plate core layer, and an upper dielectric outer layer of the back plate, and
wherein assembled layers of the back plate are patterned before etching the sound channel.

* * * * *